US008659971B2

(12) United States Patent
Wang et al.

(10) Patent No.: US 8,659,971 B2
(45) Date of Patent: Feb. 25, 2014

(54) WORD-LINE VOLTAGE REGULATING CIRCUIT AND SINGLE POWER SUPPLY MEMORY

(75) Inventors: Lei Wang, Shanghai (CN); Yi Xu, Shanghai (CN); Xiaojin Guan, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 71 days.

(21) Appl. No.: 13/541,600

(22) Filed: Jul. 3, 2012

(65) Prior Publication Data

US 2013/0010536 A1    Jan. 10, 2013

(30) Foreign Application Priority Data

Jul. 5, 2011   (CN) .......................... 2011 1 0187079

(51) Int. Cl.
 *G11C 7/00*    (2006.01)
(52) U.S. Cl.
 USPC .................. 365/226; 365/189.06; 365/189.07
(58) Field of Classification Search
 USPC .......... 365/226, 189.06, 189.07, 189.09, 229, 365/185.2
 See application file for complete search history.

(56) References Cited

U.S. PATENT DOCUMENTS 8,125,846 B2 * 2/2012 Lee ............................... 365/226

\* cited by examiner

*Primary Examiner* — David Lam
(74) *Attorney, Agent, or Firm* — Muncy, Geissler, Olds & Lowe, P.C.

(57) ABSTRACT

A word-line voltage regulating circuit and a single power supply memory are disclosed. The word-line voltage regulating circuit includes: a charge pump for raising an input voltage to a desired value and outputting the raised input voltage as an output voltage; a controller for inputting a refresh signal to the charge pump according to the output voltage of the charge pump; and a comparator for inputting a feedback signal to the charge pump according to a comparison result between the output voltage of the charge pump and a reference voltage. The charge pump works under control of the refresh signal when the memory is in an active mode, and works under control of the feedback signal when the memory is in a standby mode. The word-line voltage regulating circuit can effectively reduce the power consumption and can meet the requirement for proportional scale-down of integrated circuits.

15 Claims, 3 Drawing Sheets

US 8,659,971 B2

WORD-LINE VOLTAGE REGULATING CIRCUIT AND SINGLE POWER SUPPLY MEMORY

CROSS-REFERENCES TO RELATED APPLICATIONS

This application claims the priority of Chinese patent application number 201110187079.X, filed on Jul. 5, 2011, the entire contents of which are incorporated herein by reference.

TECHNICAL FIELD

The present invention relates to memory devices, and more particularly, to a word-line voltage regulating circuit for single power supply memory devices and a single power supply memory device employing the word-line voltage regulating circuit.

BACKGROUND ART

In a memory device (e.g. a flash memory), a power supply is required to provide memory cells with voltages and/or electrical currents for normal operations. Generally, there are two power supplies arranged in a conventional flash memory, for example, one of which serves as a core power supply and has a voltage of such as 1.5V or 1.8V; the other serves as an interface power supply and has a voltage of such as from 1.6V to 5.5V.

In such flash memories with two power supplies, when a read operation is required, for example, with a read voltage of 2.5V, the read voltage is preferably provided by the one having a higher voltage among the core power supply and the interface power supply, so as to simplify the circuit design and reduce the power consumption to a largest extent. However, with the development of the integration of integrated circuits, flash memory structures with a single power supply are developed to meet the requirement of simpler configuration of the circuits.

When performing a read operation to a flash memory, the read voltage is usually needed to be adjusted to achieve a better accuracy, for example, in certain flash memories, the read voltage is required to be precisely of 2.5V. FIG. 1 is a schematic block diagram illustrating an existing word-line voltage regulating circuit for single power supply memory. As shown in FIG. 1, a charge pump is used in a flash memory to raise the voltage of the single power supply to a value of for example from 4V to 6V; a controller is provided for monitoring the output voltage PWL of the charge pump, and for refreshing the charge pump by using a refresh signal EPUMPWL when the output voltage of the charge pump is lower than 4V, so as to activate the charge pump to raise the output voltage, and also for prohibiting the refresh operation of the charge pump by using the refresh signal EPUMPWL when the output voltage of the charge pump PWL is higher than 6V.

The output voltage PWL of the charge pump provides electrical power supply to a standby word-line voltage regulator and an active word-line voltage regulator. The refresh signal EPUMPWL outputted by the controller is also used to control the standby word-line voltage regulator such that the standby word-line voltage regulator works to adjust the output voltage PWL of the charge pump to 2.5V when the flash memory is in a standby mode.

Further, when the memory cell is in an active mode, an activate signal SEN is inputted into the active word-line voltage regulator to activate the active word-line voltage regulator, so that the active word-line voltage regulator adjusts the output voltage of the charge pump PWL to 2.5V.

Both the standby word-line voltage regulator and the active word-line voltage regulator use MOS transistor-based voltage regulating circuits to make the output voltage VD25=VDD+Vth, where VDD is the voltage of the single power supply, and Vth is the threshold voltage of a MOS transistor.

However, there are some problems existing in the word-line voltage regulating circuit shown in FIG. 1. First, whenever the memory device is in a standby mode or in an active mode, the voltage PWL in the above-mentioned circuit is always maintained in the range of from 4V to 6V (that is, the average voltage of PWL is about 5V), while the actual output voltage after adjustment is only 2.5V, causing the waste of a half of the voltage PWL, or in other words, a half of the power will be wasted even when there is no electrical current loss.

Second, in the above-mentioned circuit, the output voltage VD25=VDD+Vth, where Vth is the threshold voltage of a MOS transistor and is typically 0.7V, so the voltage of the power supply VDD=1.8V. With the scaling down of integrated circuits, the voltage of the power supply VDD may be scaled down accordingly, but the threshold voltage of the MOS transistor is unable to be proportionally scaled down, as a result, the word-line voltage regulating circuit for single power supply memory shown in FIG. 1 cannot meet the requirement for proportional scale-down of integrated circuits.

SUMMARY OF THE INVENTION

An objective of the present invention is to provide a word-line voltage regulating circuit which can effectively reduce the power consumption and can meet the requirement for proportional scale-down of integrated circuits. A single power supply memory employing the word-line voltage regulating circuit is also provided.

According to a first aspect of the present invention, a word-line voltage regulating circuit for single power supply memory is provided, which includes: a charge pump for raising an input voltage to a desired value and outputting the raised input voltage as an output voltage; a controller for inputting a refresh signal to the charge pump according to the output voltage of the charge pump; and a comparator for inputting a feedback signal to the charge pump according to a comparison result between the output voltage of the charge pump and a reference voltage, wherein a read control signal controls the controller and the comparator, so as to deactivate the controller and activate the comparator when the single power supply memory is in an active mode, and to activate the controller and deactivate the comparator when the single power supply memory is in a standby mode; the charge pump works under control of the refresh signal in the active mode, and works under control of the feedback signal in the standby mode.

By using the above word-line voltage regulating circuit, different output voltages of the charge pump are provided in different modes, i.e. the active mode or the standby mode, so as to effectively reduce the power consumption.

Preferably, the word-line voltage regulating circuit for single power supply memory may further include a voltage clamper and a voltage supply circuit; the voltage clamper includes a first MOS transistor and a second MOS transistor; the voltage supply circuit supplies a first gate voltage to a gate electrode of the first MOS transistor in the standby mode and supplies a second gate voltage to a gate electrode of the second MOS transistor in the active mode, wherein a voltage difference between the first gate voltage and the second gate voltage is equal to a threshold voltage of the MOS transistors.

By using the above word-line voltage regulating circuit, the final output voltage will not be associated with the threshold voltage of a MOS transistor, so as to satisfy the need for proportional scale-down of integrated circuits.

Preferably, the word-line voltage regulating circuit for single power supply memory may further include a voltage divider connected between the charge pump and the comparator; the voltage divider divides the output voltage of the charge pump and supplies a divided output voltage to the comparator.

By introducing a voltage divider, the requirements on the comparator and the workload of the comparator can be reduced.

Preferably, the voltage supply circuit in the word-line voltage regulating circuit for single power supply memory includes a regulator outputting the first gate voltage and the second gate voltage according to the output voltage of the charge pump, the reference voltage and the refresh signal of the controller.

Preferably, the regulator in the word-line voltage regulating circuit for single power supply memory includes an operational amplifier, an output P-type transistor, and a first resistor and a second resistor connected in serial; the operational amplifier has an output terminal connected to a gate electrode of the output P-type transistor, a first input terminal connected to the reference voltage, and a second input terminal connected between the first resistor and the second resistor.

According to the second aspect of the present invention, a single power supply memory employing the word-line voltage regulating circuit according to the first aspect of the present invention is provided.

It should be understood by those skilled in the art that, by employing the word-line voltage regulating circuit according to the first aspect of the present invention, the memory according to the second aspect of the present invention can achieve the same beneficial effects as achieved by the word-line voltage regulating circuit according to the first aspect of the present invention.

BRIEF DESCRIPTION OF THE DRAWINGS

The features, aspects, and advantages of the present invention will become better understood with regard to the following description and accompanying drawings, wherein.

It should be mentioned that, the accompanying drawings are intended to be illustrative but not to limit the present invention, wherein drawings illustrating structures may not be drawn in scale, and like reference numerals refer to the same items.

DETAILED DESCRIPTION

The present invention is further detailed by embodiments in combination with the drawings to make it clearer and easier to understand.

Figure 1:
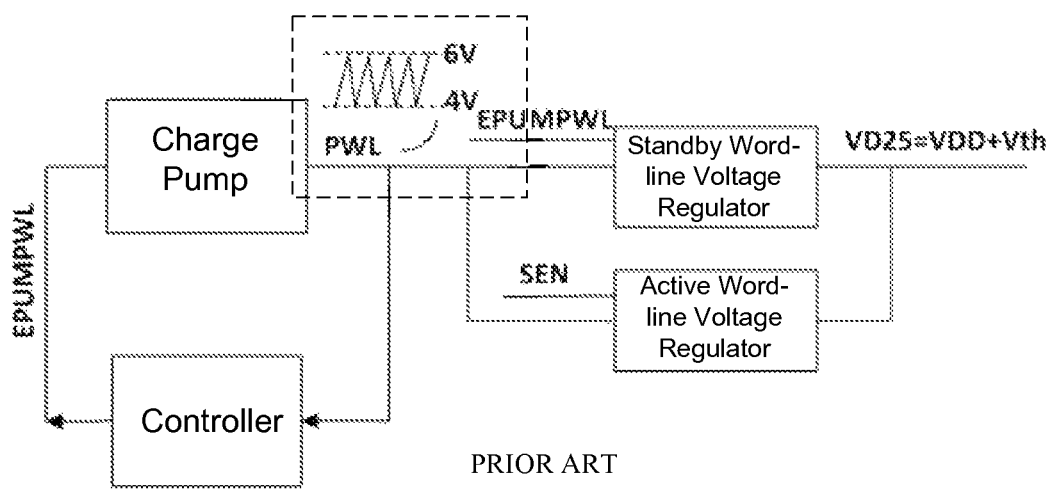
FIG. 1 is a schematic block diagram of an existing word-line voltage regulating circuit for single power supply memory.
Figure 2:
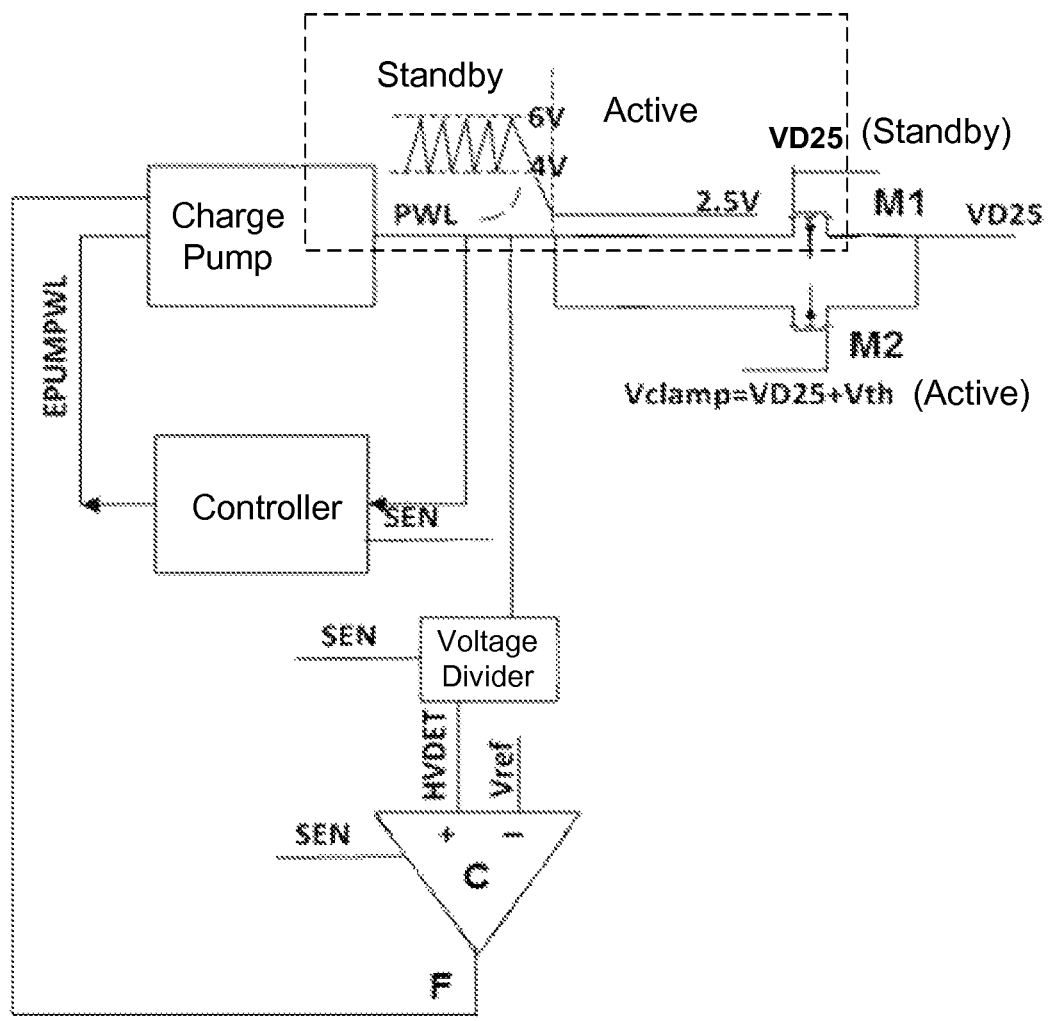
FIG. 2 is a schematic block diagram of the word-line voltage regulating circuit for single power supply memory according to an embodiment of the present invention.

FIG. 2 is a schematic block diagram of the word-line voltage regulating circuit for single power supply memory according to an embodiment of the present invention.

The word-line voltage regulating circuit for single power supply memory according to the embodiment of the present invention includes:
- a charge pump for raising an input voltage to a desired value, in this embodiment, the desired value is from 4V to 6V when the single power supply memory is in a standby mode, and the desired value is 2.5V when the single power supply memory is in a read mode (active mode);
- a controller for inputting a refresh signal EPUMPWL to the charge pump according to the output voltage of the charge pump;
- a comparator C for inputting a feedback signal F to the charge pump according to a comparison result between the output voltage of the charge pump and a reference voltage Vref, wherein a read control signal SEN controls the controller and the comparator, so as to deactivate the controller and activate the comparator in the active mode, and to activate the controller and deactivate the comparator in the standby mode. The charge pump works under control of the refresh signal EPUMPWL in the active mode, and works under control of the feedback signal F in the standby mode, that is, the comparator C is controlled by the read control signal SEN, such that the comparator C is only activated in the active mode, and is deactivated in the standby mode.

Preferably, the word-line voltage regulating circuit for single power supply memory according to the embodiment of the present invention further includes a voltage divider connected between the charge pump and the comparator; the voltage divider divides the output voltage of the charge pump and supplies a divided output voltage to the comparator C. By introducing a voltage divider, the requirements on the comparator C and the workload of the comparator C can be reduced. The divider may also be controlled by the read control signal SEN, such that the divider is activated in the active mode, and is deactivated in the standby mode.

By using the above word-line voltage regulating circuit, the output voltage of the charge pump in the active mode will no longer be from 4V to 6V, but will be 2.5V, leading to a significant reduction in power consumption. Thus, different output voltages of the charge pump are provided in different modes, i.e. the active mode or the standby mode, so as to effectively reduce the power consumption.

However, if the output voltage of the charge pump PWL is directly applied to a memory cell for read operation, then the output voltage PWL will decline from a value between 4V and 6V to 2.5V when the memory cell is switched from the standby mode to the active mode; since the output voltage PWL is much higher than 2.5V during the voltage declining process, the memory cell may be damaged due to high voltage. For this reason, an output voltage clamp circuit (voltage damper) is introduced in the present invention.

Referring to FIG. 2, the word-line voltage regulating circuit for single power supply memory further includes a voltage clamper and a voltage supply circuit. The voltage clamper includes a first MOS transistor M1 and a second MOS transistor M2. The voltage supply circuit supplies a first gate voltage VD25 of 2.5V (an example of the desired read voltage) to a gate electrode of the first MOS transistor M1, and supplies a second gate voltage of Vclamp=VD25+Vth (i.e. 2.5V+Vth) to a gate electrode of the second MOS transistor M2, wherein Vth is the threshold voltage of a MOS transistor. Thus, it could be found that, a voltage difference between the first gate voltage and second gate voltage is equal to the threshold voltage Vth of the MOS transistors.

In the standby mode, the output voltage PWL is from 4V to 6V and the gate voltage of the first MOS transistor M1 is 2.5V, thus the first MOS transistor M1 works in a sub-VT region, and there is no channel current flowing through the first MOS transistor M1 (only a small sub-VT current), therefore, the voltage of the other terminal of the first MOS transistor M1 (i.e., the output voltage) is equal to the gate voltage, namely, 2.5V (the desired read voltage).

In the active mode, the output voltage PWL is 2.5V and the gate voltage of the second MOS transistor M2 Vclamp=VD25+Vth, so that the second MOS transistor M2 works in the linear region, and the voltage of the other terminal of the second MOS transistor M2 is Vclamp−Vth= (VD25+Vth)−Vth=VD25=2.5V (the desired read voltage).

Therefore, by employing the voltage clamper, the output voltage is substantially maintained at 2.5V.

And it could also be found that, by employing the above word-line voltage regulating circuit, the final output voltage will not be associated with the threshold voltage of the MOS transistor, so as to satisfy the need for proportional scale-down of integrated circuits.

Figure 3:
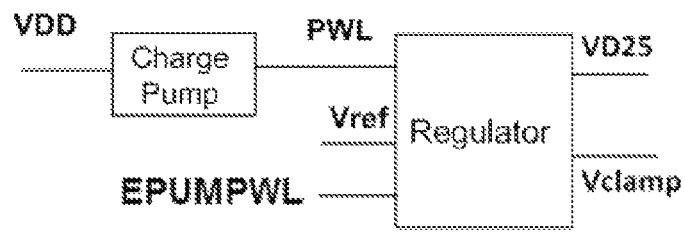
FIG. 3 is a schematic block diagram of the voltage supply circuit used in the word-line voltage regulating circuit as shown in FIG. 2.

FIG. 3 is a schematic block diagram of the voltage supply circuit for the word-line voltage regulating circuit as shown in FIG. 2. In FIG. 3, the voltage supply circuit includes a regulator, wherein the regulator outputs the first gate voltage VD25 and the second gate voltage Vclamp according to the output voltage of the charge pump PWL, the reference voltage Vref and the refresh signal EPUMPWL of the controller. In the standby mode, the voltage supply circuit only supplies the first gate voltage to the first MOS transistor M1 and does not supply any voltage to the second MOS transistor M2, and in the active mode, the voltage supply circuit only supplies the second gate voltage to the second MOS transistor M2 and does not supply any voltage to the first MOS transistor M1.

Figure 4:
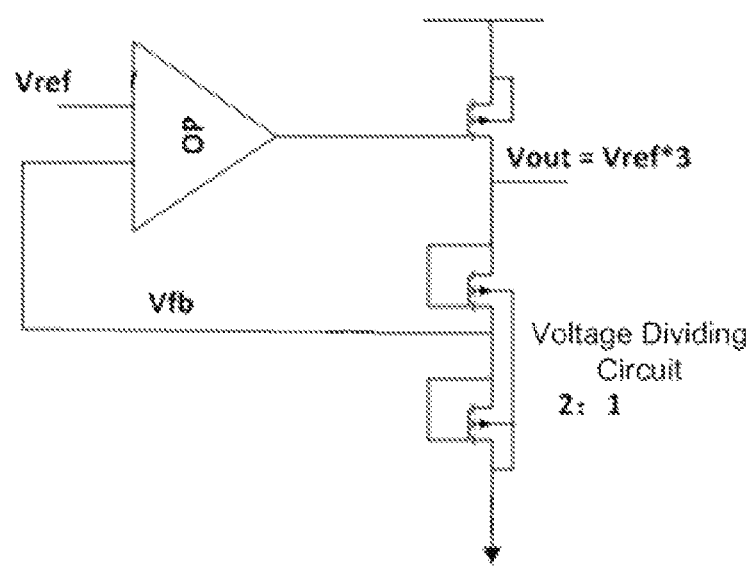
FIG. 4 is a schematic block diagram of the regulator used in the voltage supply circuit as shown in FIG. 3.

FIG. 4 is a schematic block diagram of the regulator used in the voltage supply circuit as shown in FIG. 3. In FIG. 4, the regulator may include: an operational amplifier OP, an output P-type transistor, a first resistor and second resistor connected in serial, wherein the operational amplifier OP has an output terminal connected to a gate electrode of the output P-type transistor, a first input terminal connected to the reference voltage Vref, and a second input terminal connected to a feedback voltage Vfb, wherein the feedback voltage Vfb is led out from the connecting point of the first and the second resistors, or in other words, the second input terminal of the operational amplifier OP is connected between the first and the second resistors.

The first resistor and the second resistor constitute a voltage dividing circuit, for example, if the voltage ratio between the first resistor and the second resistor is 2:1, the output voltage of the regulator Vout as shown in FIG. 4 will be equal to 3*Vref.

It is noted that, although the principle of the present invention is illustrated by a read voltage of 2.5V, it should be understood by those skilled in the art that, read voltages of other than 2.5V also can be applied in the present invention.

The above embodiments only illustrate the principles and beneficial effects of the present invention, but do not intend to limit the present invention. Any one of those skilled in the art can make modifications and variations to the above embodiments without departing from the spirit or scope of the present invention. Therefore, the scope of right protection of the present invention should be determined according to the scope as displayed in the claims.

What is claimed is:

1. A word-line voltage regulating circuit for single power supply memory, comprising:
   a charge pump for raising an input voltage to a desired value and outputting the raised input voltage as an output voltage;
   a controller for inputting a refresh signal to the charge pump according to the output voltage of the charge pump; and
   a comparator for inputting a feedback signal to the charge pump according to a comparison result between the output voltage of the charge pump and a reference voltage,
   wherein, a read control signal controls the controller and the comparator, so as to deactivate the controller and activate the comparator when the single power supply memory is in an active mode, and to activate the controller and deactivate the comparator when the single power supply memory is in a standby mode,
   and wherein the charge pump works under control of the refresh signal in the active mode, and works under control of the feedback signal in the standby mode.

2. The word-line voltage regulating circuit for single power supply memory according to claim 1, further comprising:
   a voltage clamper and a voltage supply circuit, the voltage clamper comprising a first MOS transistor and a second MOS transistor, the voltage supply circuit supplying a first gate voltage to a gate electrode of the first MOS transistor in the standby mode and supplying a second gate voltage to a gate electrode of the second MOS transistor in the active mode, wherein a voltage difference between the first gate voltage and the second gate voltage is equal to a threshold voltage of the MOS transistors.

3. The word-line voltage regulating circuit for single power supply memory according to claim 2, wherein the voltage supply circuit comprises a regulator, the regulator outputting the first gate voltage and the second gate voltage according to the output voltage of the charge pump, the reference voltage and the refresh signal of the controller.

4. The word-line voltage regulating circuit for single power supply memory according to claim 3, wherein the regulator comprises an operational amplifier, an output P-type transistor, and a first resistor and a second resistor connected in serial, the operational amplifier having an output terminal connected to a gate electrode of the output P-type transistor, a first input terminal connected to the reference voltage, and a second input terminal connected between the first resistor and the second resistor.

5. A single power supply memory employing the word-line voltage regulating circuit according to claim 4.

6. The single power supply memory according to claim 5, wherein the single power supply memory is a single power supply flash memory.

7. A single power supply memory employing the word-line voltage regulating circuit according to claim 3.

8. The single power supply memory according to claim 7, wherein the single power supply memory is a single power supply flash memory.

9. A single power supply memory employing the word-line voltage regulating circuit according to claim 2.

10. The single power supply memory according to claim 9, wherein the single power supply memory is a single power supply flash memory.

11. The word-line voltage regulating circuit for single power supply memory according to claim 1, further comprising:

a voltage divider connected between the charge pump and the comparator, the voltage divider dividing the output voltage of the charge pump and supplying a divided output voltage to the comparator.

12. A single power supply memory employing the word-line voltage regulating circuit according to claim 11.

13. The single power supply memory according to claim 12, wherein the single power supply memory is a single power supply flash memory.

14. A single power supply memory employing the word-line voltage regulating circuit according to claim 1.

15. The single power supply memory according to claim 14, wherein the single power supply memory is a single power supply flash memory.

* * * * *